United States Patent [19]
Umehara

[11] Patent Number: 5,623,123
[45] Date of Patent: Apr. 22, 1997

[54] SEMICONDUCTOR DEVICE PACKAGE WITH SMALL DIE PAD AND METHOD OF MAKING SAME

[75] Inventor: Norito Umehara, Oita, Japan

[73] Assignee: Texas Instruments Incorporated, Dallas, Tex.

[21] Appl. No.: 258,119

[22] Filed: Jun. 10, 1994

[30] Foreign Application Priority Data

Jun. 10, 1993 [JP] Japan ................................ 5-165248

[51] Int. Cl.⁶ ........................................... H01L 23/28
[52] U.S. Cl. ........................ 174/52.2; 29/841; 29/827; 257/676; 257/787
[58] Field of Search ........................ 174/52.1–52.4; 257/666, 667, 676, 787, 788; 29/825, 827, 830, 841

[56] References Cited

U.S. PATENT DOCUMENTS 4,857,989  8/1989  Mori et al. ........................ 357/80
5,182,630  1/1993  Omi et al. ........................ 257/787
5,237,205  8/1993  Newman ........................ 257/783
5,334,803  8/1994  Yamamura et al. ............. 174/52.4

*Primary Examiner*—Bot L. Ledynh
*Attorney, Agent, or Firm*—William E. Hiller; Richard L. Donaldson

[57] ABSTRACT

Semiconductor device package 53 having a lead frame with a mounting pad 31 smaller than the IC chip 10 mounted thereon, and a method of making a semiconductor device package based on wire bonding using a heater insert 38 with a mounting pad insertion concave part 51. Separation between the mounting pad and an encapsulating resin is eliminated, cracks are not created in the resin, or are considerably reduced, and warpage of the package can be prevented. Also, bonding of wires between leads and respective bonding pads 17 on the chip 10can be executed stably and efficiently.

17 Claims, 11 Drawing Sheets

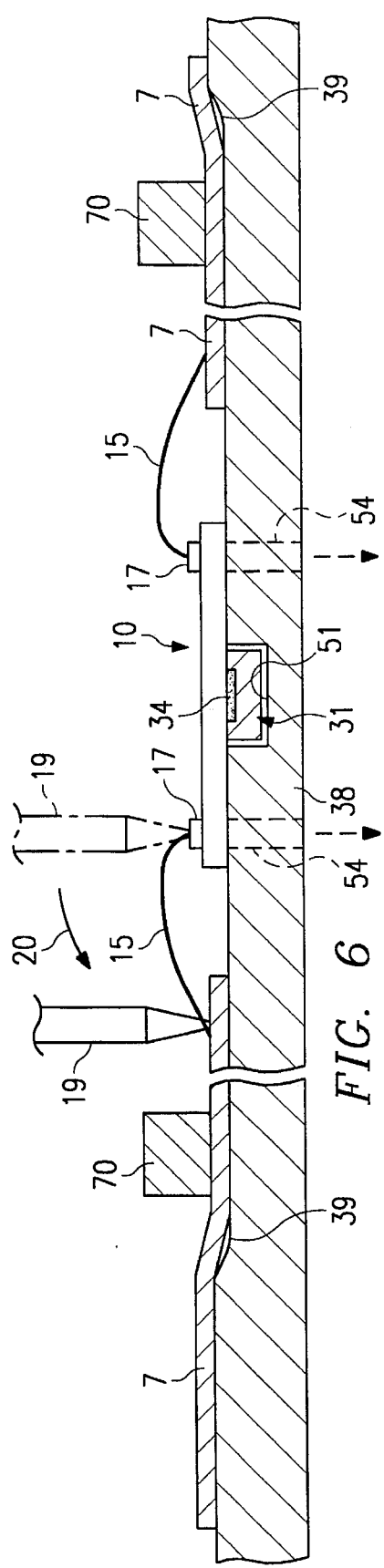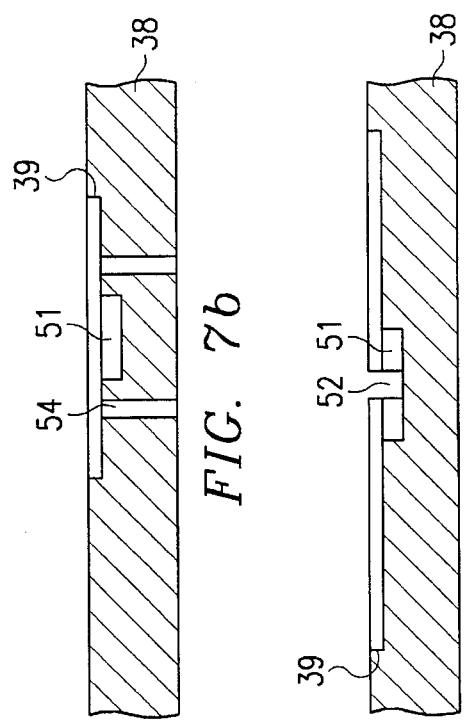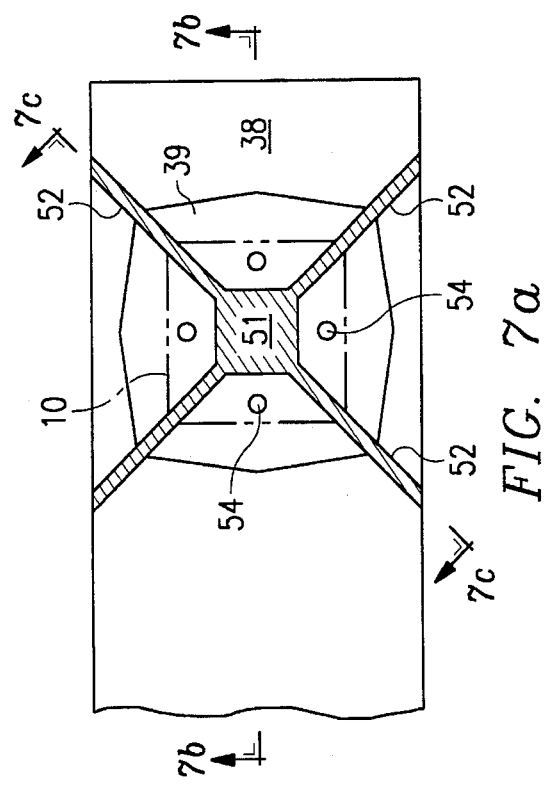

1

SEMICONDUCTOR DEVICE PACKAGE WITH SMALL DIE PAD AND METHOD OF MAKING SAME

This invention relates to a semiconductor device, in particular, a package structure in which a semiconductor integrated circuit (IC) chip is sealed in resin, the manufacturing method of making same, and a lead frame.

BACKGROUND OF THE INVENTION

Conventionally, what is shown in FIGS. 19–20 is known as the mounting structure for IC chips, and lead frame material 1 shown in FIG. 21 is used in the mounting.

The lead frame material 1 is formed entirely of metal (e.g., 42 alloy, copper alloy, copper, etc.), and lead frame outer frame 2 and lead frame part 8 having a plurality of inner leads 7 extending radially in four directions in the inside position are formed as one body by etching, etc.

Namely, in lead frame part 8, outer leads 6 are connected by linear connection parts (dumb bar) 9 at each side and the connection parts are integrated to outer frame 2 with each corner part of lead frame part 8.

IC chip 10 is mounted on a square shaped mounting pad (die pad) 11 having a larger area than the area of IC chip 10. Support pins 12 which support the mounting pad 11 are provided on the mounting pad 11 and are integrated with outer frame 2 at the corner parts. 4 in the figure is the hole for positioning the lead frame material.

Semiconductor package 13, which is fixed, wire bonded, and resin-sealed as shown in FIGS. 22–24 using the lead frame material 1, is mounted (fixed) with silver paste 14 on mounting pad 11 as shown in FIGS. 19–21. Pad 17 is bonded to inner lead 7 with wire 15, and structured to be totally sealed with resin 16 such as epoxy, etc. In FIG. 20, the alternating long and short dashed line indicates the outer line of sealing resin 16 and alternating long and two short-dashed line indicates the position of IC chip 10.

When manufacturing the package 13, IC chip 10 is mounted with silver paste 14 on mounting pad 11 as shown in the enlarged figure of FIG. 22.

Next, heater member (heater insert or heater block) 18 is contacted to mounting pad 11 from the bottom side during the wire bonding as shown in FIG. 23 so that heat of the heater is conducted to the bonding pad (pad 17) simultaneous with supporting mounting pad 11.

Wire bonding is executed by coupling wire 15 to bonding pad 17 with capillary 19 while providing thermal and ultrasonic energy, guiding it to inner lead 7 as indicated by arrow 20, then cladding it.

As noted above, in the conventional package structure, mounting pad 11 of IC chip 10 was formed to be larger than IC chip 10, but this was mainly due to the following reasons.

First of all, if mounting pad 11 is made smaller than IC chip 10 as shown in FIG. 24 during the bonding, the peripheral part of mounting pad 11 does not contact heater insert 18, so IC chip 10 slants during the ultrasonic function based on capillary 19, the support becomes unstable, ultrasonic energy cannot be used effectively, and the heat from heater insert 18 is not conducted efficiently to IC chip 10. Thus imperfect bonding is executed. Therefore, making the mounting pad 11 smaller than IC chip 10 was considered by those in the industry to be impractical and undesirable.

Also, when soldering resin sealed package 13 to a circuit pattern 22 on a printed circuit board 21 as shown in FIGS. 25 or FIG. 26, solder 23 is fused by solder reflow (e.g., IR reflow by infrared irradiation) then solidified, but cracks 24 may be created in resin 16 as shown in the figures.

If the overall thickness of package 13 is sufficient, the cracks 24 are not created, but when thinning and enlargement in the chip are required as in recent years, separation part 25 is easily created at the boundary of resin 16 in the mounting pad 11 as shown in FIG. 25, and the phenomenon of cracks 24 being created from edge 11a of pad 11 has been observed from time to time.

This is due to the peripheral water vapor preserved by the package being sucked into the hold resin, the water vapor condensing and becoming water between the lead frame and the resin, the water converting to water vapor during the IR reflow, which suddenly expands causing so-called vapor explosion, resulting in the peeling off of the resin from the lead frame.

Assisting in causing the phenomenon of the cracks in the resin, curvature is created and the package itself is deformed due to warpage remaining on the inside of the package after the completion of resin molding and setting due to differences in the thermal expansion coefficient of the mounting pad, IC chip, and resin.

Also, as another cause for the cracks, it is a fact that silver paste 14 for fixing IC chip 10 is a material with very high hygroscopicity, such that the hygroscopic moisture may cause vapor explosion during the heating such as IR reflow, etc.

Namely, as shown in FIG. 26, pad 11 is deformed by the condensed water causing vapor explosion due to a phenomenon similar to the above-mentioned in the part with silver paste 14, great stress is applied to resin 16, and cracks 24 are created in particular from edge 11a of pad 11.

It is an object of the present invention to provide a semiconductor device package in which the generation of warpage and cracks in the sealing resin and the lead frame thereof is noticeably reduced or prevented.

It is another object of the present invention to provide a method of making a semiconductor device package, wherein the bonding of the semiconductor element and leads can be achieved efficiently and stably.

SUMMARY OF THE INVENTION

The present invention relates to a semiconductor package device in which a semiconductor element is sealed in resin and fixed to a mounting part (e.g., a mounting pad and/or an additional mounting part for the support pins) which is smaller than the semiconductor element, and a lead frame with the mounting part.

In the semiconductor device package and lead frame of the present invention, it is preferable for a concave part to be formed on the mount surface of the mounting pad and for the concave part to be filled with a fixing agent for semiconductor element fixation. Also, it is preferable for the side surface of the mounting pad to be slanted inwardly from the semiconductor element mount surface toward the opposite surface.

Also, it is preferable for the side surface of the support pin which supports the mounting pad to be slanted inward from the semiconductor element mount side toward the opposite surface. Also, it is possible for additional mounting parts to be provided to the support pin, and to fix semiconductor elements even on this mounting part. In this case, it is preferable for the concave part to be formed in the additional mounting part of the support pin and to fill the concave part with a fixing agent for semiconductor element fixation.

It is preferable for the semiconductor device package of the present invention to be manufactured by the method of inserting a mounting pad and/or support pin in the insertion concave part formed on the heater member with respect to the lead frame (in particular, a lead frame with a mounting pad smaller than the semiconductor element), and in this state, contacting the heater member to the back surface of the semiconductor element fixed to the mounting pad and/or support pin, and bonding the inner lead of the lead frame to the semiconductor element.

As the heater member used in the manufacturing method, it is preferable to also form an insertion concave part for the support pins of the mounting pad. Also, it is preferable to make the mounting pad insertion concave part to be larger than the mounting pad.

BRIEF DESCRIPTION OF THE DRAWINGS

FIG. 6 is a partially sectional view showing the wire bonding stage during the method of making the semiconductor device package.

FIG. 7(a) is a top plan view of a heater insert used in the wire bonding.

FIG. 7(b) is a cross-sectional view of the heater insert taken along line b—b of FIG. 7(a).

FIG. 7(c) is a cross-sectional view of the heater insert taken along line c—c of FIG. 7(a).

Figure 1:
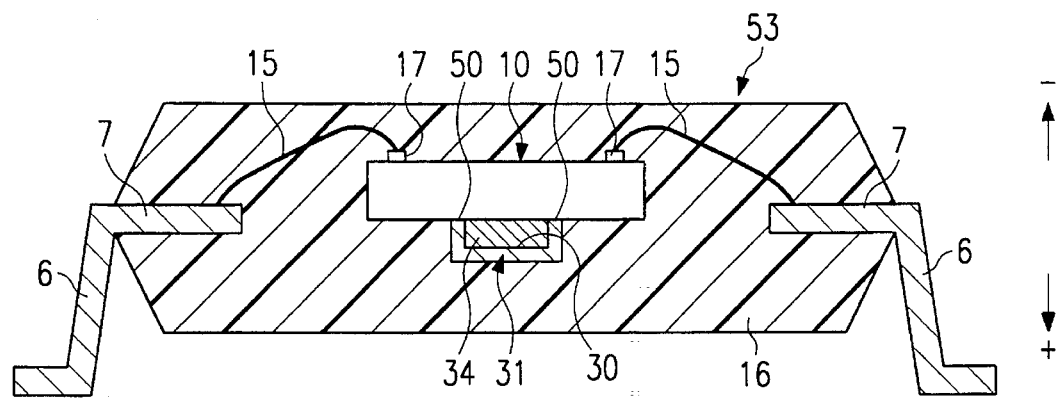
FIG. 1 is a cross-sectional view of a semiconductor device package according to an embodiment of the present invention.
Figure 2:
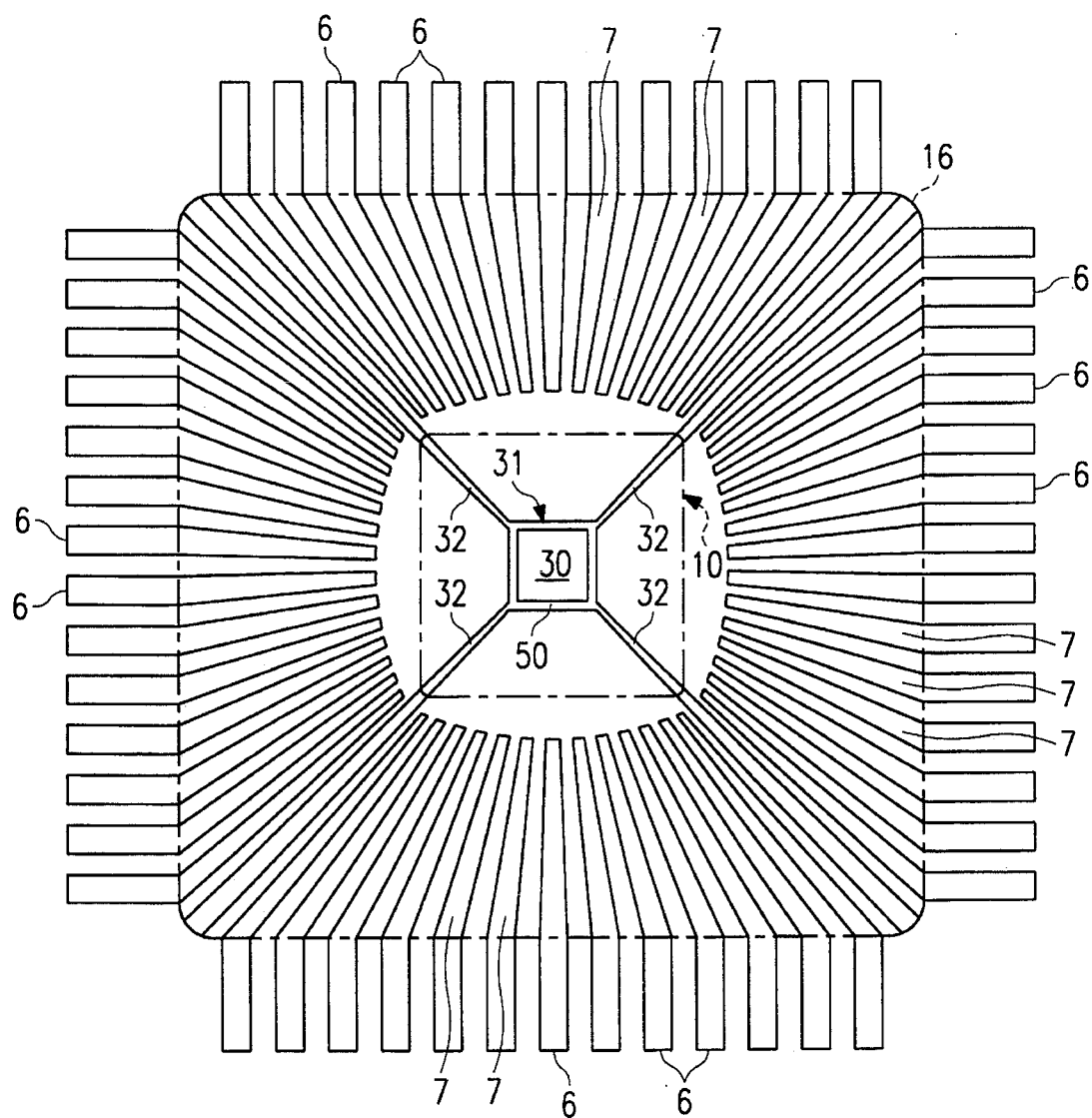
FIG. 2 is a top plan view of the lead frame of the package.

Reference numerals as shown in the drawings:

1, 41 ... lead frames, 6, 7 ... leads, 8 ... lead frame part, 10 ... IC chip, 11, 31 ... mounting pads, 13, 53 ... semiconductor packages, 14, 34 ... silver paste, 15 ... wire, 16 ... sealing resin. 17 ... bonding pad, 18, 38 ... heater insert (heater block), 19 ... capillary, 21 ... print wiring plate, 22 ... circuit pattern, 23 ... solder, 24 ... crack, 25 ... separation part, 30, 51, 52, 63, 64 ... concave parts, 32 ... support pin, 39 ... gradation, 60, 61 ... slanted surface, 62 ... additional mounting part, 70 ... inner lead clamp.

DESCRIPTION OF THE PREFERRED EMBODIMENTS

FIGS. 1–8 show a first embodiment of the present invention. In this embodiment, the parts common to the conventional semiconductor device package explained earlier are designated with the same reference numerals and the description thereof may be omitted.

In the lead frame 41 and semiconductor package 53 of this embodiment, the fact that the square-shaped mounting pad (die pad) 31 for mounting (fixing) the IC chip 10, is formed smaller than the IC chip 10, contrary to the common practice of the industry, is its major characteristic.

Also, other features include a square-shaped concave part 30 formed on the chip mounting surface of the mounting pad 31, and a fixing agent 34 such as silver paste, etc., filling in the concave part for fixation of the IC chip 10, wherein the fixing agent 34 is not adhered to the junction part 50 of IC chip 10 and mounting pad 31 (namely, the fixation surface of fixing agent 34 exists within more or less the same plane as the mounting surface of mounting pad 31).

The area of mounting pad 31 can be 15–40% of the chip size of IC chip 10 but when the stress, influenced by the silver paste quantity, and displacement in the position of IC chip 10 during handling, which will be discussed later, are considered, the smaller the better. For example, when the size of IC chip 10 is 8 mm×8 mm, a mounting pad 31 of about 4 mm×4 mm (about 25% of the area of IC chip 10) is considered suitable.

Figure 3:
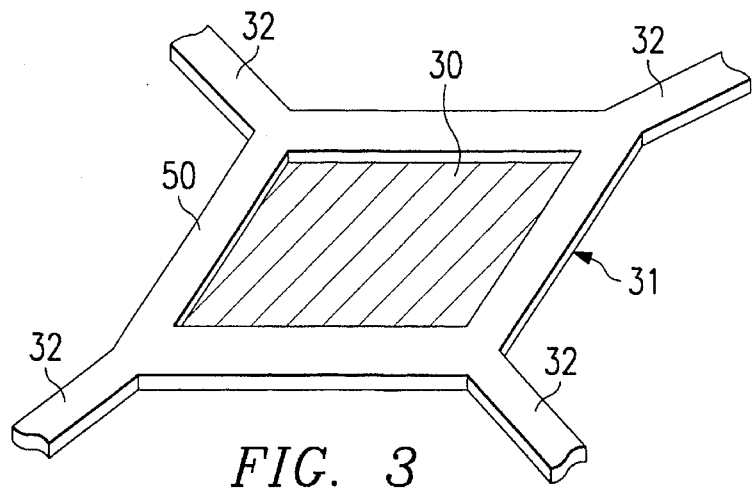
FIG. 3 is an enlarged perspective view of the mounting pad in the lead frame part.
Figure 4:
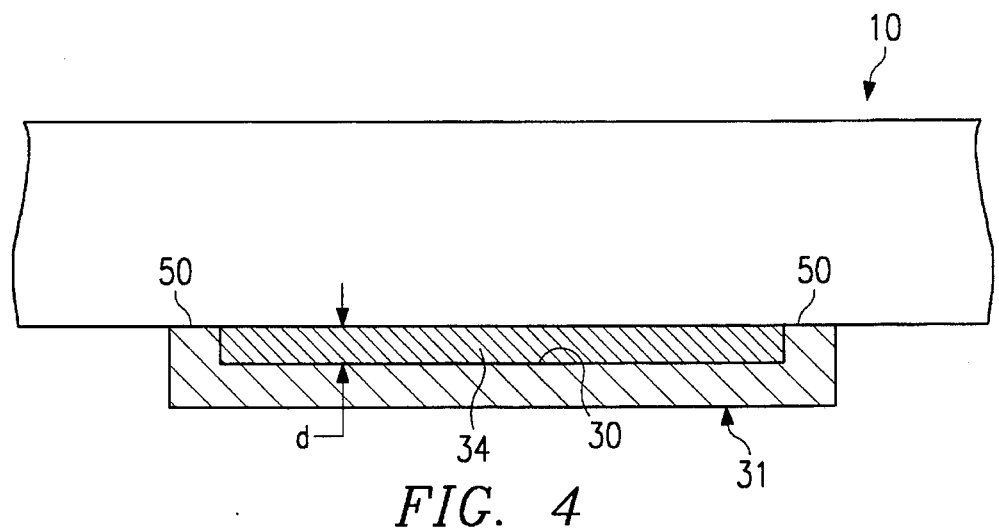
FIG. 4 is an enlarged cross-sectional view of the mounting pad with an attached IC chip.
Figure 5:
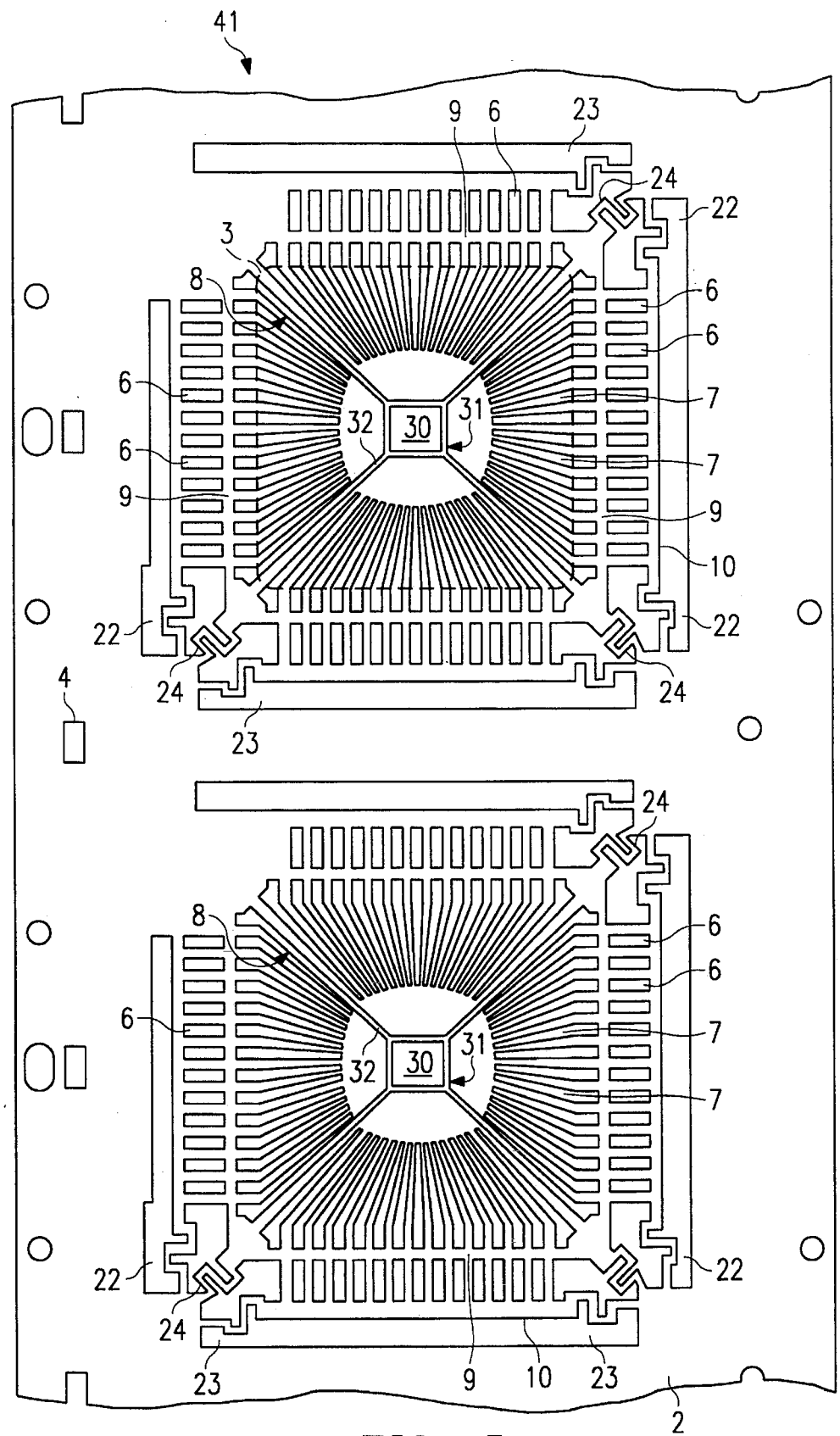
FIG. 5 is a top plan view of one part of the lead frame.

This type of mounting pad 31 is formed as one body by etching, etc., as part of the lead frame 41 as shown in FIG. 5 along with support pins 32 (furthermore, leads 6 and 7, etc.). Concave part 30 of mounting pad 31 can be formed by partial etching as indicated in FIG. 3 and the depth d can be the thickness (e.g., about 30 μm) of silver paste 34 as shown in FIG. 4.

Figure 21:
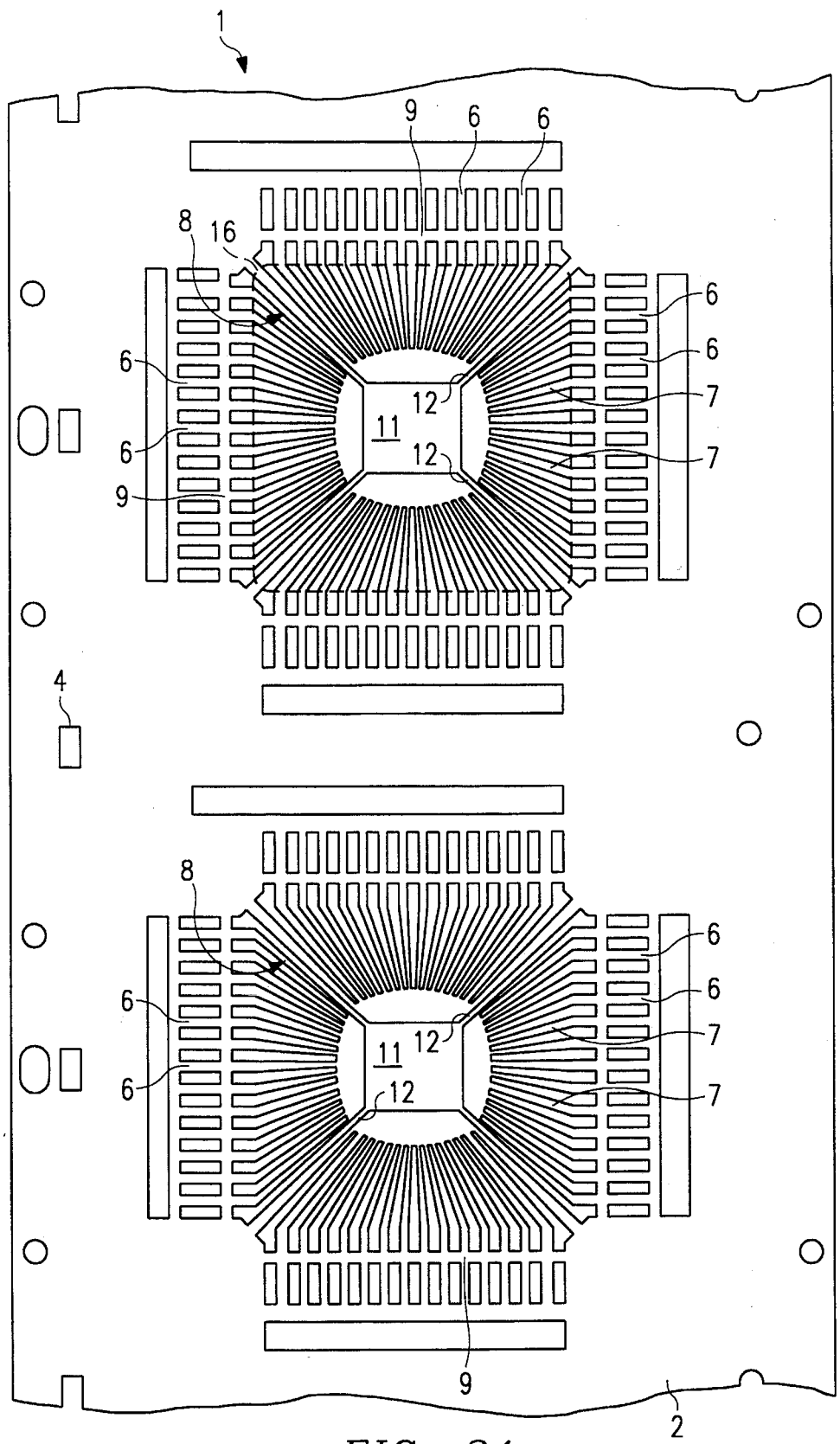
FIG. 21 is a top plan view of one part of the lead frame as employed in conventional semiconductor device package.
Figure 22:
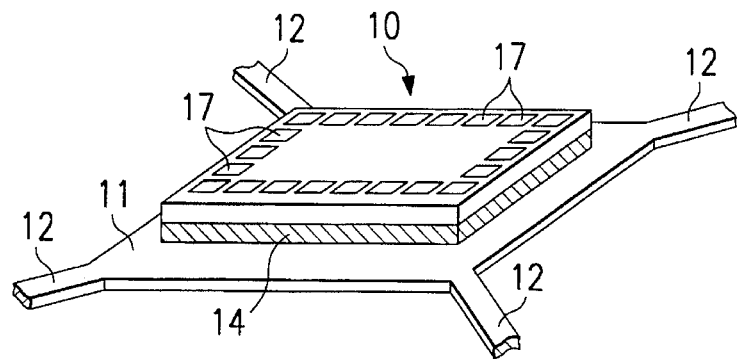
FIG. 22 is an enlarged perspective view of the mounting pad of the lead frame.
Figure 23:
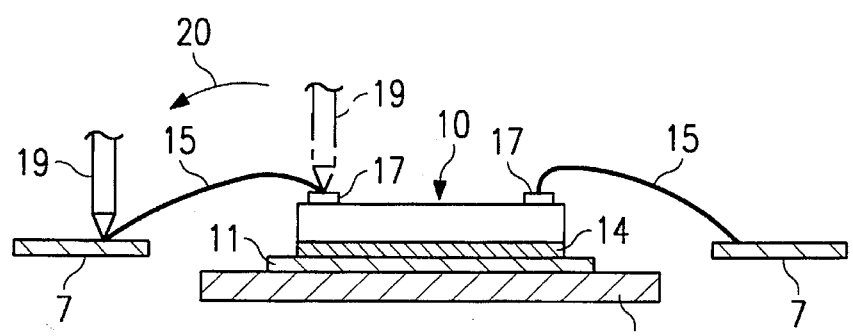
FIG. 23 is a partially sectional view during wire bonding in a conventional method of making a semiconductor device package.
Figure 24:
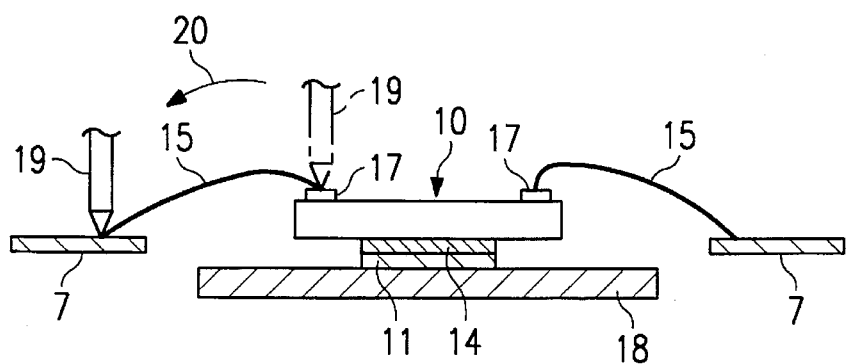
FIG. 24 is a partially sectional view during wire bonding using another mounting pad in a conventional method of making a semiconductor device package.

In the lead frame 41, one corner part (the corner part at the top left in FIG. 5) of the four corner parts of lead frame part 8 is directly fixed to an outer frame 2 of the lead frame 41 as in FIG. 21 and the other three corner parts are respectively connected to the outer frame 2 of the lead frame 41 through three snake-shaped bent parts 22, 23, and 24. According to the lead frame 41, even if a temperature difference is created between lead frame part 8 and outer frame 2 during the heating process such as wire bonding, the warpage stress which may be generated in directions such as vertical, horizontal, etc., is effectively absorbed by the elastic deformation of bent parts 22, 23, and 24. As a result, dimension and positional precision (spacing of the leads, etc.) of lead frame part 8 itself is improved, and warpage of the lead frame material itself is eliminated so the conveyance becomes favorable and a smooth conveyance becomes possible.

Moreover, even if a force which pulls leads 6 and 7 is created by contraction of the resin during resin sealing after mounting of the IC chip, it is absorbed by the deformation of bending parts 22, 23, and 24. Thus warpage and deformation of the lead frame material can be prevented and reliability such as moisture proofing, etc., is improved.

Next, the process of bonding and mounting IC chip 10 will be explained in connection with the lead frame 41.

First of all, IC chip 10 is fixed (mounted) on mounting pad 31 with silver paste 34 as shown in FIG. 4. Silver paste 34 is filled within concave part 30 of mounting pad 31.

Next, as shown in FIGS. 6 and 7(a)–7(c), heater member (heater insert) 38 provided with linear concave parts (grooves) 52 arranged radially and square-shaped concave part 51 for inserting support pins 32 and mounting pad 31 is prepared. In FIG. 7(a), concave parts 51 and 52 are indicated with slanted lines.

Figure 8:
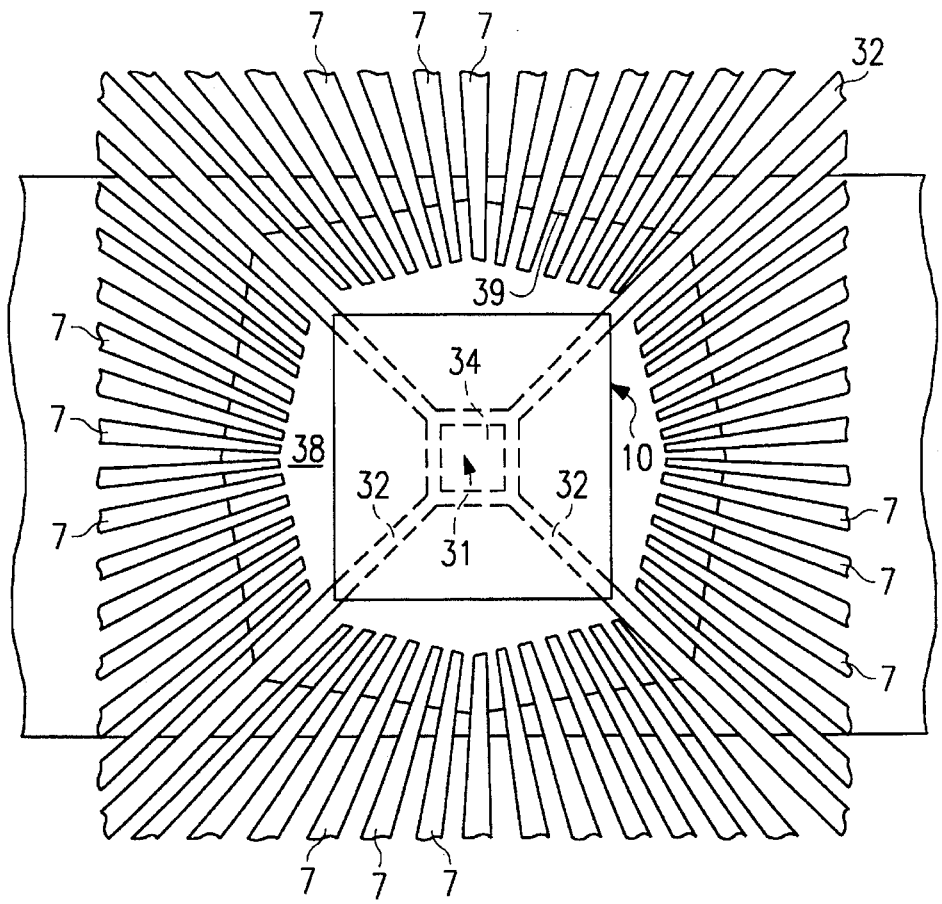
FIG. 8 is a top plan view of the main part of the lead frame during wire bonding.
Figure 10:
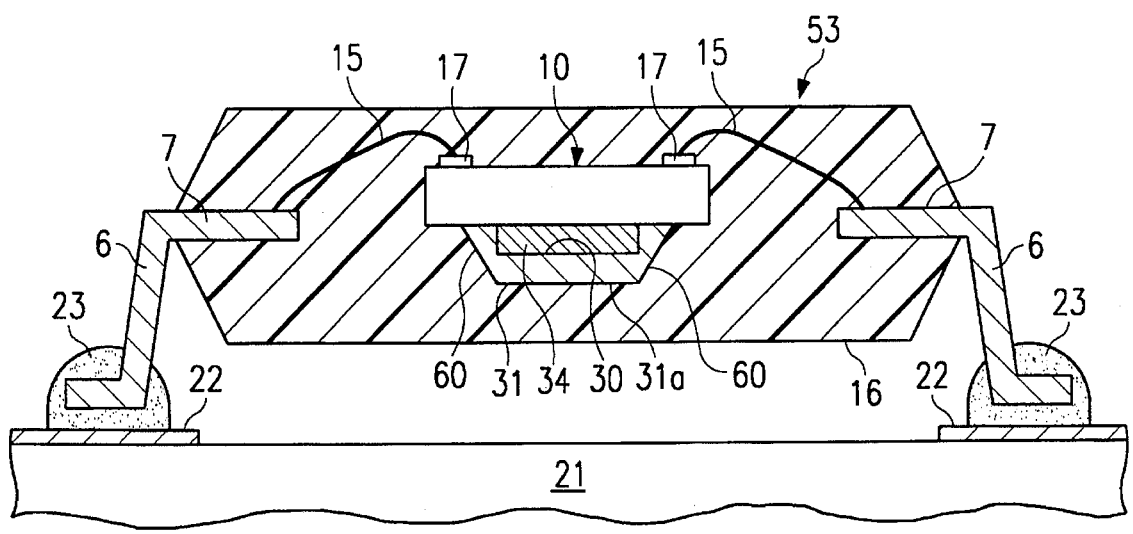
FIG. 10 is a cross-sectional view of the semiconductor device package using the lead frame during solder flow.

Then, when mounting pad 31 and support pins 32 are inserted into concave parts 51 and 52, the IC chip back surface contacts heater member 38 as shown in FIG. 8. Also, at the periphery of the IC chip, the tip area of inner lead (7) is provided with gradation 39 of heater member front surface so definite contact is made with the heater member when pressurized by inner lead clamp 70 (see FIG. 6), contact which is thermally and mechanically stable is secured as noted above, and stabilized bonding is executed. At the periphery of the IC chip, it is preferable to provide spacing of about 500 μm between support pin 32 and mounting pad 31 and between concave parts 51 and 52 of the heater member.

Wire bonding is executed by bonding wire 15 to pad 17 with capillary 19 by applying thermal or ultrasonic energy, guiding it to insert lead 7 like arrow 20, then cladding it in the same manner as noted earlier.

At this time, even if mounting pad 31 is formed to be smaller as noted above, it is supported by heater insert 38 sufficiently so wire bonding can be executed stably, and moreover, the heat from the heater can be conducted directly to IC chip 10 from heater insert 38 so thermal efficiency is not lost.

It is possible to provide a through-hole 54, as is indicated with a broken line in FIG. 6, to heater insert 38, and to adsorb IC chip 10 onto heater insert 38 by vacuum suctioning through the through-hole 54 to hold it stably. Also, in addition, it is possible to mechanically fix IC chip 10 to heater insert 38 with a clamper (not shown in the figure), etc.

After the completion of wire bonding, sealing is executed with resin 16 as shown in FIG. 1, the unnecessary part of outer lead 6 is cut off, and a semiconductor device package 53 is created.

As is apparent from the above, in the package and lead frame of this embodiment, mounting pad 31 is formed to be smaller than IC chip 10 and silver paste 34 fills in concave part 30 so the following functional effects (1)–(5) can be obtained.

Figure 25:
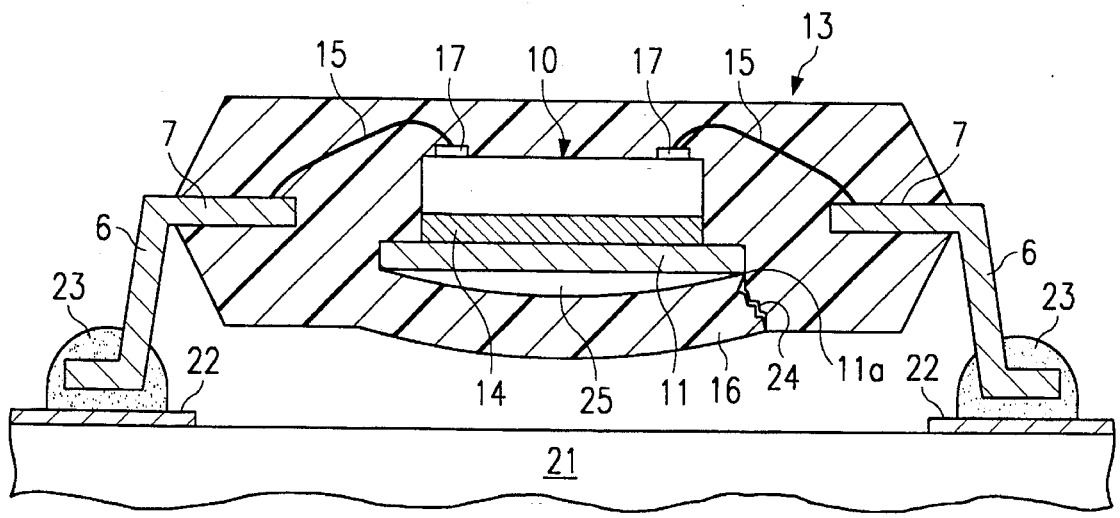
FIG. 25 is a cross-sectional view of a conventional semiconductor package during solder flow.

(1) Mounting pad 31 is small so moisture in the vicinity of pad 31 is reduced by that much, and moreover, warpage due to the difference in the thermal expansion and contraction of pad 31 becomes minimal. Separation between resin 16 and pad 31 caused by vapor explosion, as was explained in FIG. 25, is eliminated during heating (e.g., IR reflow, resin-sealing, etc.), and cracks are not created in the resin or cracks are reduced considerably.

(2) In this case, resin 16 is directly adhered to IC chip 10 at the periphery of pad 31, so the interfacial separation of IC chip 10 and resin 16 does not easily occur, since the adhesion between silicon (IC chip 10) and epoxy resin (sealing resin 16) is very favorable, and the chance for water collecting at the interface and causing vapor explosion is decreased.

Figure 26:
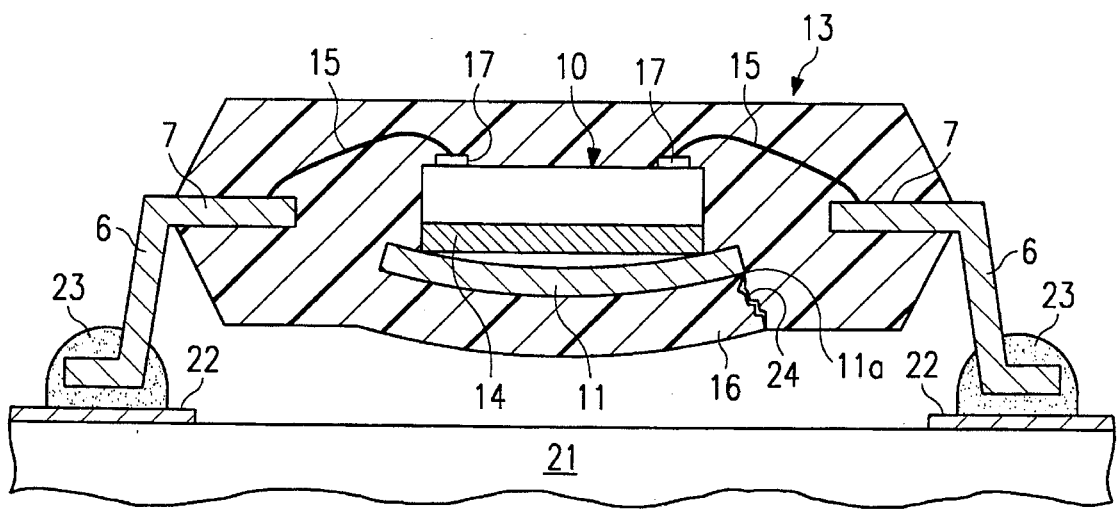
FIG. 26 is a cross-sectional view of a conventional semiconductor device package during solder flow.

(3) Moreover, silver paste 34 fills the concave part 30 of pad 31, and does not protrude onto junction surface 50 of IC chip 10 and pad 31. The silver paste quantity can be reduced so in addition to being able to achieve a cost decrease, emission and dispersion of moisture and emission of occluded gas originating in the silver paste are minimal, and cracks are not created in resin 16 due to vapor explosion as shown in FIG. 26, or cracks are reduced considerably. Also, it is not necessary to use epoxy resin of low stress like resin 16. Thus the gas quantity emitted from silver paste can be reduced further.

Figure 19:
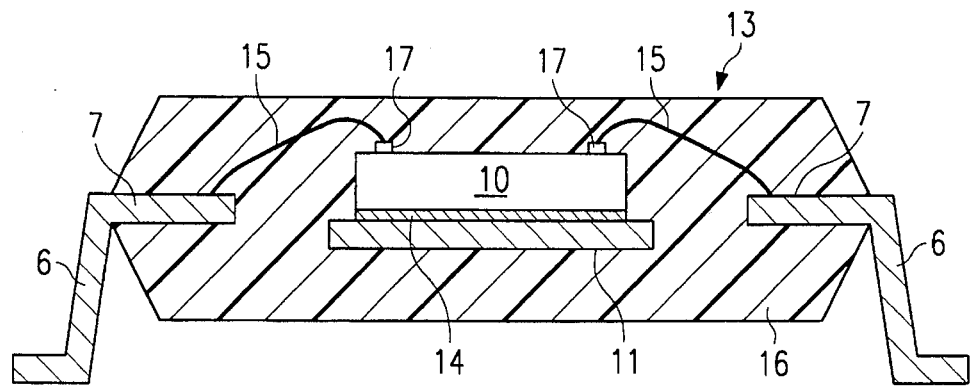
FIG. 19 is a cross-sectional view of a conventional semiconductor device package.
Figure 20:
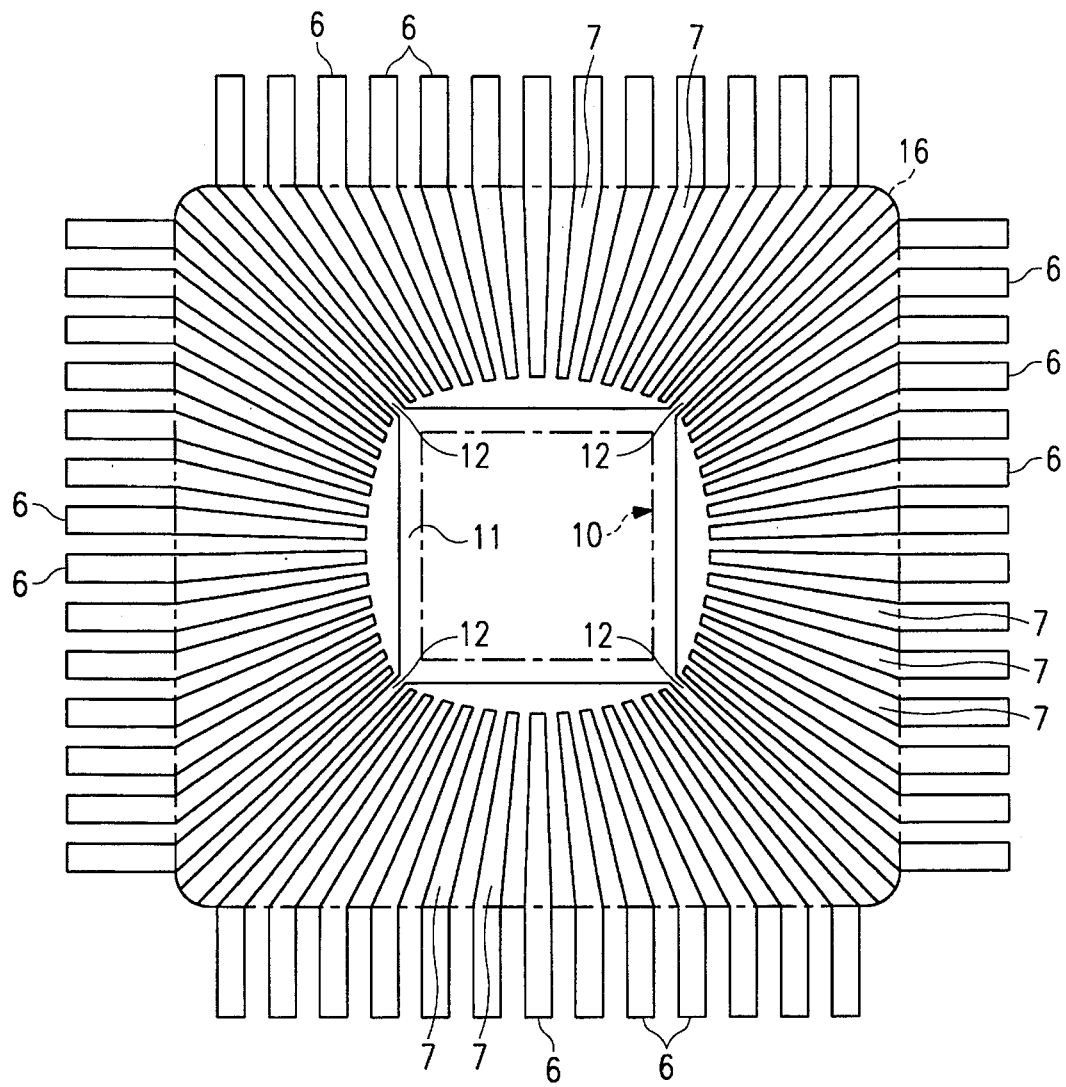
FIG. 20 is a top plan view of the lead frame part of the semiconductor device package of FIG. 19.

(4) Silver paste 34 fills the concave part 30, so the total thickness of IC chip 10, silver paste 34, and mounting pad 31 becomes smaller by the thickness of the silver paste (e.g., about 30 μm) compared to the conventional example in FIG. 19 and can reduce the total thickness of the structure when made into a semiconductor device package.

(5) Mounting pad 31 is small, so the size of IC chip 10 mounted on it does not depend on the size of mounting pad 31, thus the freedom in selecting the chip size to be mounted increases.

Also, the manufacturing method of packages according to this embodiment uses heater insert 38 provided with mounting pad insertion concave part 51 and executes bonding by directly supporting IC chip 10 at the periphery so the following functional effects (6)–(7) are manifested.

(6) When wire bonding, mounting pad 31 can be supported reliably on heater insert 38 even when small, as shown in FIGS. 6–9, and moreover, the support is further stabilized since pad 31 and pin 32 are inserted into concave parts 51 and 52 of heater insert 38. Therefore, wire bonding can be executed stably.

(7) Also, in this case, IC chip 10 directly contacts heater insert 38 so heat conduction to the IC chip (particularly, pad 17) from the heater and the ultrasonic energy are not lost. Therefore, bonding strength is maintained favorably, and even if the ultrasonic energy of the capillary 19 or the heat of the heater is made low, sufficient bonding can be executed.

Next, the functional effects of the embodiment, particularly results of the concrete test regarding crack resistance executed under the conditions below, are shown in Table I.

A package that had been set (cured) after resin-sealing was shelved for a prescribed period of time (refer to Table I below) at 85° C./85% RH. Thereafter, it was placed on a printed wiring board then passed through an IR reflow furnace (maximum temperature 245° C./5 sec) once. Thereafter, the cracks on the inside of the resin were observed with an ultrasonic detector.

The materials, etc., used here are as follows.

Package: 176 pins QFP (resin part 24 mm×24 mm×1.4 mm thickness)
Mold resin: Biphenol epoxy resin
Silver paste: Low-stress epoxy silver paste
Wire: Au wire, 27 μm diameter

TABLE I

| MOUNTING PAD SIZE (mm) | CHIP SIZE (mm) | CHIP THICKNESS (mm) | CRACK GENERATION COUNT * | |
|---|---|---|---|---|
| | | | 24 HR | 48 HR |
| 10 × 10 | 8.1 × 8.3 | 0.28 | 0/12 | 12/12 |
| 4 × 4 | 9.8 × 9.8 | 0.38 | 0/12 | 0/12 |
| 4 × 4 | 8.1 × 8.3 | 0.28 | 0/16 | 0/16 |

* Crack generation count: crack generated package count/sample count

From the results, it is apparent that the crack resistance improves noticeably as compared to a conventional package, due to having made the size of the mounting pad smaller than the size of the IC chip in accordance with the present invention (in the above, the area of IC chip is 17% or 24%).

Furthermore, using the sample, the functional effects of the embodiment, particularly, the results of the temperature cycle test, which is one test of the temperature resistance properties necessary in semiconductor products used in the following conditions, are shown in Table II.

A package that was set (cured) after resin-sealing was subjected to moisture absorption for 168 h at 85° C./30% RH. Thereafter, it was passed through an IR reflow furnace (maximum temperature 245° C./5 sec) three times. Thereafter, a temperature cycle test (150° C./−65° C., as the timing, held for 10 min at each temperature) was executed in prescribed frequency. Thereafter, cracks on the inside part of the resin were observed with an ultrasonic detector as above and by external inspection.

TABLE II

| MOUNTING PAD SIZE (mm) | CHIP SIZE (mm) | CHIP THICKNESS (mm) | CRACK GENERATION COUNT * | |
|---|---|---|---|---|
| | | | 200 cycle | 500 cycle |
| 12 × 12 | 9.8 × 9.8 | 0.38 | 12/12 | 12/12 |
| 4 × 4 | 9.8 × 9.8 | 0.38 | 0/12 | 0/12 |

* Crack generation count: count of packages with cracks generated/sample

This data also clearly indicates that the crack resistance is noticeably improved compared to the conventional package.

Also, the curvature of the package was measured. Namely, with the depth at the back surface (the surface on the bottom side of the IC chip 10 in FIG. 1, for example) of the center position of the package shown in FIG. 1 as 0, the depth at the four corner positions of the package was measured (the thickness of the package was 1.4 mm, the IC chip size was 8.1 mm×8.3 mm, and the IC chip thickness was 0.28 mm). The curvature on the package front surface side was expressed with negative depth and curvature on the back surface side was expressed with positive depth, and the average value of the measured depth at the four corners was evaluated as the "curvature of the package." The results are shown in Table III (however, the unit of depth is μm).

TABLE III

| | CONVENTIONAL PACKAGE (MOUNTING PAD 10 mm × 10 mm) | EMBODIMENT OF PACKAGE ACCORDING TO INVENTION (MOUNTING PAD 4mm × 4 mm) |
|---|---|---|
| MINIMUM DEPTH | 41.3 | −34.8 |
| MAXIMUM DEPTH | 123.3 | 21.8 |
| AVERAGE DEPTH | 95.4 | −9.3 |
| STANDARD DEVIATION | 27.3 | 22.1 |

This result indicates that curvature is reduced considerably in the package based on the present invention as compared to the conventional example.

FIGS. 9–18 show other embodiments of the present invention.

Figure 9:
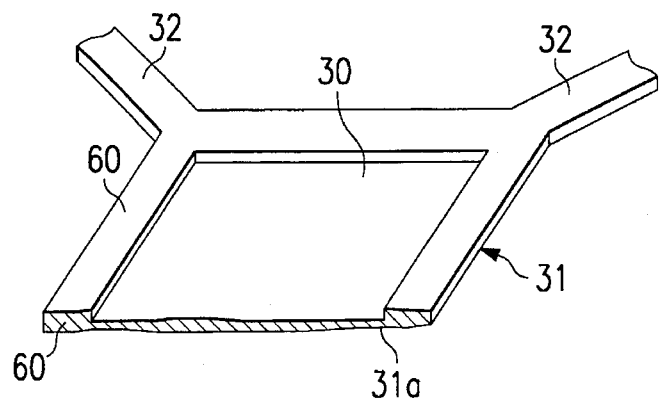
FIG. 9 is a partially broken away perspective view of the mounting pad in the lead frame based on another embodiment of the present invention.

In the example shown in FIG. 9, side surface 60 at the four sides of the mounting pad 31 is slanted inwardly, for example, linearly from chip mounting surface (front side) towards the opposite surface (back surface). In conformance therewith, even the side surface of the concave part 51 receiving heater insert 38 shown in FIG. 6 is slanted.

By thus slanting the side surface of mounting pad 31, the insertion of heater insert 38 into the concave part 51 is made easy and the inserted state of the heater insert 38 after the insertion is further stabilized. Also, it is possible to disperse the stress generated between mounting pad 31 and resin 16 by the heat applied during the IR reflow shown in FIG. 10 along slanted surface 60, and to relax the concentration of stress compared to when edge 31a of pad 31 is at a right angle, thereby preventing cracks in the resin 16 even more effectively. The slanted shape of the side surface 60 is not limited to a linear shape but can be other shapes such as a curved shape, etc.

Figure 11A:
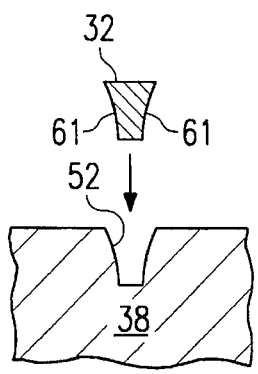
FIG. 11(a) is an enlarged cross-sectional view showing a support pin of the mounting pad in another embodiment of the present invention prior to insertion into the concave part of the heater insert.
Figure 11B:
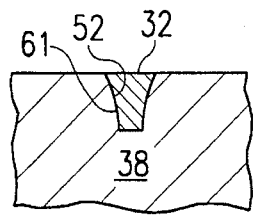
FIG. 11(b) is an enlarged cross-sectional view similar to FIG. 11(a), but showing the support pin inserted in the concave part of the heater insert.

The example shown in FIGS. 11(a) and 11(b) illustrates the slanted side surface 61 of the support pin 32, for example, as a curved shape from the IC chip mounting side (surface side) inwardly towards the opposite side (back side).

In conformance therewith, when the side surface of insertion concave part 52 of heater insert 38 is slanted, insertion of the support pin 32 becomes simple as indicated in FIGS. 11(a) and 11(b) when placing the lead frame into heater insert 38 and the inserted state of the support pin 32 is further stabilized. The support pin 32 is even more effective when combined with a mounting pad 31 having a slanted surface 60 as shown in FIG. 9. The slanted shape of the side surface 61 of the support pin 32 is not limited to a curved shape and can be other shapes such as a linear shape, etc.

Figure 12A:
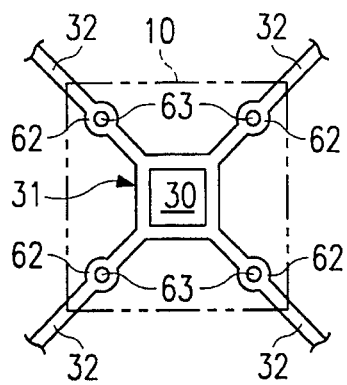
FIGS. 12(a)–12(d) are top plan views of other embodiments of the portion of the lead frame in association with the semiconductor element in accordance with the present invention.

In the example of FIG. 12(a), the adhesive strength of IC chip 10 on the lead frame is improved by providing an additional mounting part 62 of a circular shape on the support pin 32 and fixing IC chip 10 even on the mounting part 62 when the adhesive strength of the IC chip 10 as secured with respect to mounting pad 31 is insufficient. In this case, it is preferable to form a concave part 63 in the mounting part 62 which is to be filled with the silver paste for chip fixation in mounting part 62 by partial etching, etc.

Figure 12B:
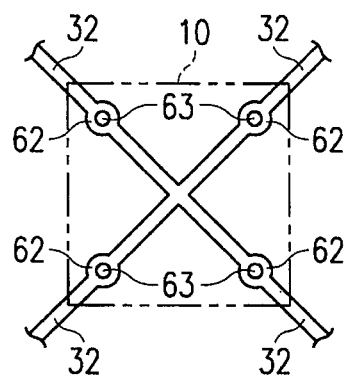
Figure 12C:
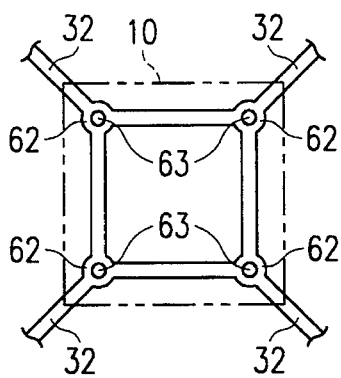
Figure 12D:
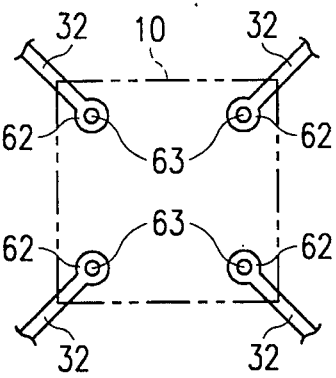

Furthermore, as additional modifications of the embodiment of FIG. 12(a), there are FIGS. 12(b), 12(c), and 12(d), and when compared to FIG. 12(a), there is no mounting pad at the center part. The mounting part 62 is not limited to circular shape and can be of various shapes such as triangular, square, other polygonal shapes, or elliptic shapes.

Figure 13:
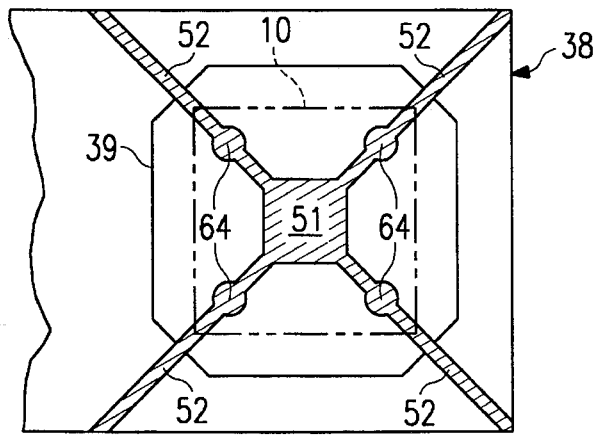
FIG. 13 is a top plan view of a heater insert used in the lead frame.

In conformance with support pin 32 attached to the mounting part 62, a circular shaped mounting part insertion concave part 64 is also formed on heater insert 38 as in shown FIG. 13.

Figure 14:
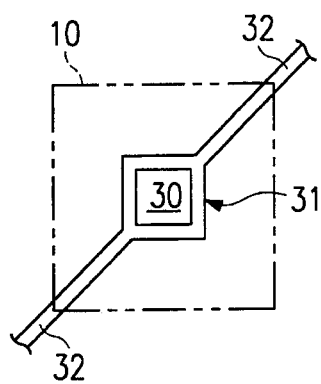
FIG. 14 is a top plan view of the lead frame part according to another embodiment of the present invention.

FIG. 14 shows an example of providing two support pins 32 on the diagonal line of mounting pad 31, whereas the previously described examples are provided with support pins 32 at the four corners (a total of four support pins 32) of mounting pad 31.

Even if the number of support pins 32 is two, mounting pad 31 can be sufficiently supported. Furthermore, there may be three support pins 32 by providing them at the three corner parts of mounting pad 31.

Figure 15:
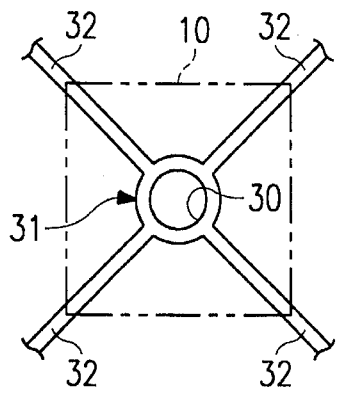
FIG. 15 is a top plan view of the lead frame part according to another embodiment of the present invention.

The example in FIG. 15 makes the shape of mounting pad 31 into another shape other than the square shape noted above, for example, a round or near round shape.

With a round pad shape, it is possible to disperse the stress between the resin and the mounting pad, to relax the stress concentration, and to improve the crack resistance. In addition to the above, the pad shape can be various shapes such as polygonal shape, curved shape, etc.

Figure 16:
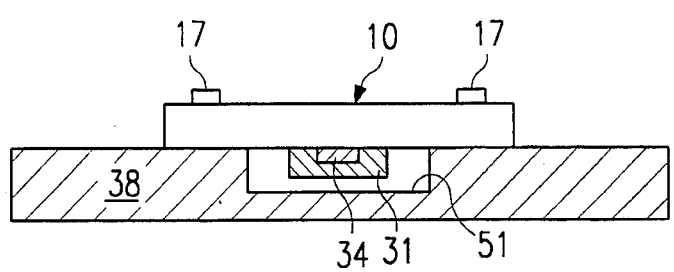
FIG. 16 is a cross-sectional view showing a mounting pad with an IC chip mounted thereon, wherein the mounting pad has been inserted in the concave part of the heater insert according to another embodiment of the present invention.

According to the example shogun in FIG. 16, mounting pad insertion concave part 51 of the heater insert 38 used for wire bonding is made larger than the mounting pad 31 so that the mounting pad 31 may be inserted into concave part 51 with a margin.

In this way, it is possible to use the heater insert 38 with respect to various types of mounting pads 31 regardless of the size and shape of mounting pad 31. Therefore, it is not necessary to change the heater insert 38 for each mounting pad.

Figure 17:
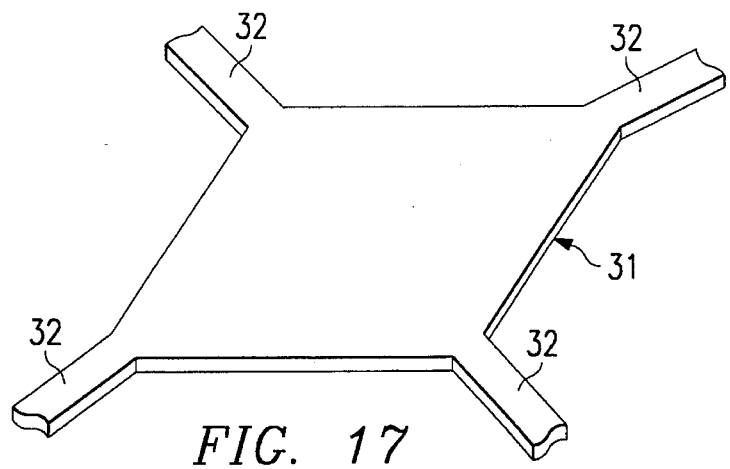
FIG. 17 is an enlarged perspective view of a mounting pad in the lead frame part according to yet another embodiment of the present invention.
Figure 18:
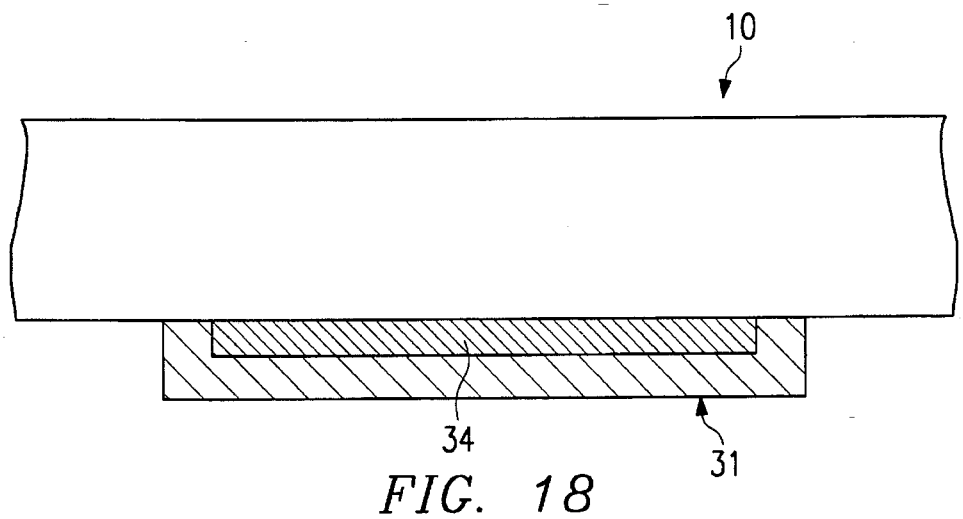
FIG. 18 is an enlarged cross-sectional view of a mounting pad with an IC chip fixed thereon.

FIGS. 17 and 18 differ from the previous examples in that a concave part for receiving the silver paste filling is not formed in mounting pad 31.

However, even with the example of FIGS. 17 and 18, it is possible to obtain the functional effects similar to the above based on the fact that mounting pad 31 is made smaller than IC chip 10. The non-concave part make-up of the example of FIGS. 17 and 18 can be applied similarly in the examples shown in FIGS. 9–16.

It will be understood that certain embodiments of the present invention have been described, but other modifications based on the technological concept of the present invention are possible.

For example, it is possible to change the shape and size of the mounting pad insertion concave part, the heater insert, the concave part to be filled by the fixing agent, the support pin, and the mounting pad. Also, even in regard to the materials, the lead frame material can be a metal such as a 42 alloy, copper alloy, copper, etc., the fixing agent can be an adhesive other than silver paste, and the heater insert can be stainless steel, etc.

Also, a configuration similar to the lead frame can be applied in other types of lead frames, for example, a tape carrier type. The bonding is also not limited to wire bonding.

The present invention can be applied to dual in-line packages, etc., and is not limited to a QFP package in which the terminals (leads) are output in four directions.

The present invention involves making the mounting part of the mounting pad, etc., smaller than the semiconductor element so the warpage of the semiconductor element created by differences in the thermal expansion and contraction of the mounting part and the resin is minimized, and the generation of curvature is also reduced. Moreover, due to the adhesion of the resin with respect to the semiconductor element being very favorable and due to an increase in the adhesion area, the adhesive strength between the resin and semiconductor element does not decrease in the vicinity of the mounting part, separation of the mounting part and the resin due to the condensation of moisture causing vapor explosion is eliminated, and cracks are not created in the resin, or at least the number of cracks are reduced considerably.

Furthermore, the mounting part is small so the size of the semiconductor element which can be mounted on it is not dependent on the size of the mounting part and the freedom in the semiconductor element size which can be mounted is increased.

When bonding to the semiconductor leads, even if the mounting part is small, it can be supported reliably on the heater insert, and moreover, the mounting part is inserted into the concave part of the heater insert so the support is stabilized even more. Therefore, bonding can be stably executed.

Moreover, the semiconductor element directly contacts the heater insert so that heat conduction and ultrasonic energy to the semiconductor element from the heater are not lost. Thus, the bonding strength is maintained favorably and even if the heat of the heater and energy needed for the cladding are made low, sufficient bonding can be executed.

I claim:

1. A semiconductor device package comprising:

a semiconductor chip having a top surface and a bottom surface, and further having a plurality of electronic-function performing components provided therein;

a plurality of bonding pad on the top surface of said semiconductor chip electrically connected to respective electronic-function performing components thereof;

a lead frame including a plurality of outwardly extending conductive leads having inner and outer integral conductive lead portions arranged about the periphery of said semiconductor chip in outwardly spaced relation thereto;

a die pad having upper and lower surfaces, said semiconductor chip being mounted on the upper surface of said die pad;

said die pad being connected to said lead frame and having a surface area smaller than the surface area of said semiconductor chip mounted thereon such that the outer peripheral portion of said semiconductor chip extends outwardly of the marginal periphery of said die pad;

said die pad having a recess defined in the upper surface thereof opposed to the bottom surface of said semiconductor chip mounted thereon;

an adherent fixing agent filling the recess in said die pad such that the upper surface of said fixing agent is disposed at least substantially in the plane of the upper surface of said die pad;

the bottom surface of said semiconductor chip being in contact with the upper surface of said fixing agent so as to be adhered to said die pad;

a plurality of electrically conductive connector wires respectively connected to bonding pads on said semiconductor chip and the inner conductive lead portions of said conductive leads of said lead frame; and a body of insulating material encapsulating said semiconductor chip, said die pad, said connector wires, and the inner lead portions of said conductive leads of said lead frame, the outer lead portions of said conductive leads of said lead frame extending outwardly of said body of insulating material.

2. A semiconductor device package as set forth in claim 1, wherein the surface area of said die pad is in the range of 15–40% of the surface area of said semiconductor chip mounted thereon.

3. A semiconductor device package as set forth in claim 2, wherein the surface area of said die pad is approximately 25% of the surface area of said semiconductor chip mounted thereon.

4. A semiconductor device package as set forth in claim 1, wherein the adherent fixing agent is silver paste.

5. A semiconductor device package as set forth in claim 1, further including a plurality of support pins integral with the periphery of said die pad and extending outwardly therefrom in integrally connected relationship with said lead frame.

6. A semiconductor device package as set forth in claim 5, wherein said die pad is configured in a quadrilateral shape having four corners;

said plurality of support pins comprising four support pins respectively integrally connected with each of the four corners of the quadrilateral die pad and integrally connected with said lead frame.

7. A semiconductor device package as set forth in claim 6, wherein said die pad in its quadrilateral configuration includes four side surfaces extending between the upper and lower surfaces thereof, said four side surfaces of said quadrilateral die pad being respectively slanted inwardly toward the lower surface of said die pad; and the inner sidewall surfaces bounding the recess defined in the upper surface of said die pad being likewise slanted inwardly from the upper surface of said die pad toward the lower surface thereof.

8. A semiconductor device package as set forth in claim 5, wherein each of said support pins is provided with a respective recess therein at a location disposed beneath and in registration with the bottom surface of said semiconductor chip;

an adherent fixing agent filling the recess in each of said plurality of support pins so as to be disposed in contact with the bottom surface of said semiconductor chip so as to adhere said semiconductor chip to each of said plurality of support pins.

9. A semiconductor device package comprising:

a semiconductor chip having a top surface and a bottom surface, and further having a plurality of electronic-function performing components provided therein;

a plurality of bonding pads on the top surface of said semiconductor chip electrically connected to respective electronic-function performing components thereof;

a lead frame including a plurality of outwardly extending conductive leads having inner and outer integral conductive lead portions arranged about the periphery of said semiconductor chip in outwardly spaced relation thereto;

a semiconductor chip mount on which the semiconductor chip is disposed, said semiconductor chip mount including a plurality of support pins underlying the bottom surface of said semiconductor chip and in engagement therewith;

each of said support pins having a recess defined in the upper surface thereof opposed to the bottom surface of said semiconductor chip;

an adherent fixing agent filling the recess in each of said plurality of support pins such that the upper surface of said fixing agent is disposed at least substantially in the plane of the upper surface of said support pin corresponding thereto;

the bottom surface of said semiconductor chip being adhered to the fixing agent disposed in the recess of each of said plurality of support pins so as to adhere said semiconductor chip to said support pins;

a plurality of electrically conductive connector wires respectively connected to bonding pads on said semiconductor chip and the inner conductive lead portions of said conductive leads of said lead frame;

said plurality of support pins being connected to said lead frame; and a body of insulating material encapsulating said semiconductor chip, said plurality of support pins, said connector wires, and the inner lead portions of said conductive leads of said lead frame, the outer lead portions of said conductive leads of said lead frame extending outwardly of said body of insulating material.

10. A semiconductor device package as set forth in claim 9, wherein said plurality of support pins comprises four support pins intersecting with each other at a common center so as to define an X-shaped configuration of support pins as the semiconductor chip mount disposed beneath said semiconductor chip with the fixing agent disposed in the recess of each of said plurality of support pins being in adherent relation with respect to the bottom surface of said semiconductor chip.

11. A semiconductor device package as set forth in claim 9, wherein said semiconductor chip mount further includes a quadrilateral inner frame having four corners;

said plurality of support pins comprising four support pins having their respective inner ends integrally connected to a respective corner of said quadrilateral inner frame and extending outwardly thereof;

the recess defined in each of said support pins being located at the juncture thereof with the corresponding corner of said inner frame and having the adherent fixing agent therein in adherent relation with respect to the bottom surface of said semiconductor chip.

12. A semiconductor device package as set forth in claim 9, wherein said semiconductor chip mount comprises separate individual support pins underlying portions of the bottom surface of said semiconductor chip and in spaced relation with respect to each other;

the recess defined in the upper surface of each of said support pins being located at the inner end thereof and having the adherent fixing agent therein in adherent relation with respect to the bottom surface of said semiconductor chip.

13. A method of making a semiconductor device package comprising the steps of:

providing a die pad of a lead frame including a plurality of outwardly extending conductive leads, wherein a recess is defined in the upper surface of the die pad;

filling the recess in said die pad with an adherent fixing agent such that the upper surface of said fixing agent is disposed at least substantially in the plane of the upper surface of said die pad;

disposing a semiconductor chip having a plurality of bonding pads on the upper surface thereof on the die pad so as to overlie the die pad with the bottom surface of said semiconductor chip in contact with the adherent fixing agent in the recess of said die pad;

securing the semiconductor chip to the die pad via the adherent fixing agent to provide a semiconductor chip assembly;

providing a heater member having an upper surface with a recess defined therein complementary to the shape of the die pad of said semiconductor chip assembly;

positioning the semiconductor chip assembly on the heater member so as to locate the die pad within the complementary recess defined in the upper surface of said heater member;

supporting the die pad of the semiconductor chip assembly within the complementary recess in the upper surface of said heater member while supporting the remainder of the semiconductor chip assembly on the upper surface of said heater member;

bonding a respective end of a connector wire to a corresponding bonding pad on the upper surface of the semiconductor chip while applying heat to the semiconductor chip assembly from the heater member; and bonding the opposite end of the connector wire to a conductive lead of the lead frame while applying heat to the semiconductor chip assembly from the heater member.

14. A method of making a semiconductor device package as set forth in claim 13, wherein the surface area of said die pad is smaller than the surface area of said semiconductor chip mounted thereon such that the outer peripheral portion of said semiconductor chip extends outwardly of the marginal periphery of said die pad, and the step of supporting the die pad of the semiconductor chip assembly within the complementary recess in the upper surface of said heater member while supporting the remainder of the semiconductor chip assembly on the upper surface of said heater member includes supporting the semiconductor chip via engagement of the portion of the bottom surface of said semiconductor chip extending outwardly of the die pad with the upper surface of said heater member; and the bonding of a respective end of a connector wire to a corresponding bonding pad on the upper surface of said semiconductor chip and the bonding of the opposite end of the connector wire to a conductive lead of the lead frame being conducted while heat is applied to said semiconductor chip and to said lead frame of the semiconductor or chip assembly from the heater member.

15. A method of making a semiconductor device package as set forth in claim 13, wherein the lead frame includes a plurality of support pins integral with the periphery of said die pad and extending outwardly therefrom; and providing the recess defined in the upper surface of the heater member with outwardly extending grooves for accommodating the plurality of support pins integral with the periphery of said die pad in a supporting relationship.

16. A method of making a semiconductor device package as set forth in claim 15, wherein the surface area of said die pad is smaller than the surface area of said semiconductor chip mounted thereon such that the outer peripheral portion of said semiconductor chip extends outwardly of the marginal periphery of said die pad, and the step of supporting the die pad of the semiconductor chip assembly within the complementary recess in the upper surface of said heater member while supporting the remainder of the semiconductor chip assembly on the upper surface of said heater member includes supporting the semiconductor chip via engagement of the portion of the bottom surface of said semiconductor chip extending outwardly of the die pad with the upper surface of said heater member; and the bonding of a respective end of a connector wire to a corresponding bonding pad on the upper surface of said semiconductor chip and the bonding of the opposite end of the connector wire to a conductive lead of the lead frame being conducted while heat is applied to said semiconductor chip and to said lead frame of the semiconductor chip assembly from the heater member.

17. A method of making a semiconductor device package as set forth in claim 16, further including applying a vacuum through at least one hole in the heater member in registration with the semiconductor chip assembly for holding the semiconductor chip assembly in place on the heater member during the bonding of the opposite ends of the connector wire to a bonding pad on the upper surface of said semiconductor chip and to a conductive lead of the lead frame respectively.

* * * * *